United States Patent
Yun et al.

(10) Patent No.: US 6,348,414 B1
(45) Date of Patent: Feb. 19, 2002

(54) METHOD FOR FORMING FINE METAL PATTERNS BY USING DAMASCENE TECHNIQUE

(75) Inventors: Hee-Yong Yun; Sung-Keun Chang, both of Kyoungki-Do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/471,575

(22) Filed: Dec. 21, 1999

(30) Foreign Application Priority Data

Dec. 24, 1998 (KR) .............................. 98-58559

(51) Int. Cl.⁷ .................... H01L 21/302; H01L 21/461
(52) U.S. Cl. ....................................... 438/692; 438/633
(58) Field of Search ................... 438/692, 633

(56) References Cited

U.S. PATENT DOCUMENTS

| | | |
|---|---|---|
| 5,877,075 A | 3/1999 | Dai et al. |
| 5,877,076 A | 3/1999 | Dai |
| 5,882,996 A | 3/1999 | Dai |
| 5,935,762 A | 8/1999 | Dai et al. |
| 5,946,567 A | 8/1999 | Weng et al. |
| 6,001,733 A * | 12/1999 | Huang et al. |
| 6,174,813 B1 * | 1/2001 | Wang .......................... 438/692 |

FOREIGN PATENT DOCUMENTS

| | | |
|---|---|---|
| JP | 8-27187 | 10/1996 |
| JP | 9-5833 | 1/1997 |
| JP | 9-20266 | 1/1997 |
| JP | 9-64962 | 3/1997 |
| JP | 9-98284 | 4/1997 |
| JP | 9-204408 | 8/1997 |

* cited by examiner

Primary Examiner—Felisa Hiteshew
(74) Attorney, Agent, or Firm—Blakely Sokoloff Taylor & Zafman

(57) ABSTRACT

There is provided a method for forming fine metal patterns of semiconductor devices using damascene technique. In the method, a glue layer and a diffusion barrier film are formed on a lower layer, in turn. An insulating film is then deposited on the barrier film and etched to form contact holes or via holes. A metal film is then deposited within the hole to form a fine metal pattern. Therefore, the method can increase the width of the metal film of the fine pattern, thereby enhancing the operation speed of the device. The method can also easily control the processes by separating the etching process of the metal film from those of the glue layer and the barrier film.

12 Claims, 10 Drawing Sheets

METHOD FOR FORMING FINE METAL PATTERNS BY USING DAMASCENE TECHNIQUE

FIELD OF THE INVENTION

The present invention relates to methods for fabricating semiconductor devices; and, more particularly, to methods for forming fine metal patterns by using damascene technique, which can form the fine patterns such as word line, bit line or the like by forming insulating film patterns and depositing the conductive film material within the hole formed between the insulating film patterns without etching the conductive film or followed by etching only the conductive film within the hole.

DESCRIPTION OF THE PRIOR ART

There will be described a method for forming fine metal patterns using damascene technique in accordance with a prior art, referring to FIGS. 1a to 1g.

First, as shown in FIG. 1a, a first insulating film 11 is formed on a semiconductor substrate 10 and selectively etched to open the regions within which metal patterns will be formed later. A second insulating film is then deposited and wholly etched to form insulating film spacers 12 on the sidewell of the first insulating film pattern 11, as shown in FIG. 1b.

Next, referring to FIG. 1c, a glue layer 13 and a diffusion barrier film 14 are, in turn, deposited over the entire structure. A metal film 15 is then formed on the diffusion barrier film 14 as shown in FIG. 1d. The glue layer 13 is for enhancing adhesive force between the metal film and lower layer (semiconductor substrate), and the diffusion barrier film 14 is for preventing the metal film from mutually reacting with the glue film 13.

Then, referring to FIG. 1e, the metal film 15, the diffusion barrier film 14 and the glue layer 13 are simultaneously etched to form metal patterns, which are insulated with the insulating film patterns 11 and the insulating film spacers 12. As shown in FIGS. 1f and 1g, an etching stop layer 16 is deposited and flattened by chemical mechanical polishing or etching until the insulating film patterns 11 are exposed, thereby being left only on the metal pattern. The etching stop layer 16 will protect the metal pattern in the subsequent process for etching the first insulating film 11 pattern to form self align contact.

As described above, since the metal film 15 of the fine metal pattern is simultaneously etched with the diffusion barrier film 14 and the glue layer 13, it is difficult to control the process in the method according to the prior art. Furthermore, in the structure of fine pattern according to the prior art, the diffusion barrier film 14 and the glue layer 13 enclose the conductive film 15 at its both sidewells and bottom. Therefore, the width of the metal film 15 is smaller than that of the predetermined and it is difficult to obtain fast operation speed from the device in accordance with the prior art.

In case of applying the prior art to fabrication of high integrated device having a line width of 0.13 µm or less, there are some difficulties in the process development that the thicknesses of the second insulating film 12, the diffusion barrier film 14 and the glue layer 13 must be decreased.

SUMMARY OF THE INVENTION

It is, therefore, an object of the present invention to provide a method for forming fine metal patterns of semiconductor devices using damascene technique, which can enhance the operation speed of the devices by increasing the width of the metal film of the fine pattern.

It is another object of the present invention to provide a method for forming fine metal patterns of semiconductor devices using damascene technique, which can easily control the processes for forming the fine pattern by depositing only the metal film material of the fine pattern within the contact hole or via hole which is formed by etching the insulating film on a lower layer. In comparison that the metal film is deposited with a diffusion barrier film and glue layer within the hole in the prior art and simultaneously etched with the other films, in the method according to the present invention, only the metal film is deposited within the hole, and the diffusion barrier film and glue layer are deposited on the lower layer, not within the hole. Therefore, only the metal film can be etched within the hole, separating the etching of the other films.

In accordance with an aspect of the present invention, there is provided a method for forming fine metal patterns of semiconductor devices using damascene technique, which comprises the steps of: forming a glue layer and a diffusion barrier film on a lower layer, in turn; forming on the diffusion barrier film, insulating film patterns which define regions of fine patterns therebetween; forming a metal film within the fine pattern region; forming an etching stop film on the metal film within the fine pattern region; removing the insulating film to expose the diffusion barrier film; and selectively etching the diffusion barrier film and the glue layer using the etching stop film as an etching mask.

In accordance with another aspect of the present invention, there is provided a method for forming fine metal patterns of semiconductor devices using damascene technique, which comprises the steps of: forming a glue layer and a diffusion barrier film on a lower layer, in turn; forming on the diffusion barrier film, a first insulating film and selectively etching it to form the first insulating film patterns which define regions of fine patterns therebetween; forming a second insulating film over the entire structure and wholly etching it to form insulating film spacers on the sidewells of the first insulating film pattern; forming a metal film within the fine pattern region; forming an etching stop film on the metal film within the fine pattern region; removing the insulating film pattern to expose the diffusion barrier film; and selectively etching the diffusion barrier film and the glue layer using the etching stop film as an etching mask.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The invention will be illustrated in detail by the following preferred embodiments with reference to the accompanying drawings.

In the method of the present invention, a glue layer and a diffusion barrier film are formed on a lower layer. Here, the glue layer is for enhancing adhesive force between the lower layer and a metal film to be formed later. The diffusion barrier film is for preventing the metal film from mutually reacting with the glue layer. An insulating film is then deposited on the barrier film and etched to form contact holes or via holes. At this time, the barrier film is exposed through the hole. A metal film is then deposited within the hole to form a fine metal pattern. Therefore, the invention can increase the width of the metal film of the fine pattern, thereby enhancing the operation speed of the device. The invention can also easily control the processes by separating the etching process of the metal film from those of the glue layer and the barrier film.

FIGS. 2a to 2k show the processes for forming fine metal patterns using damascene technique in accordance with one embodiment of the present invention.

Figure 1A:
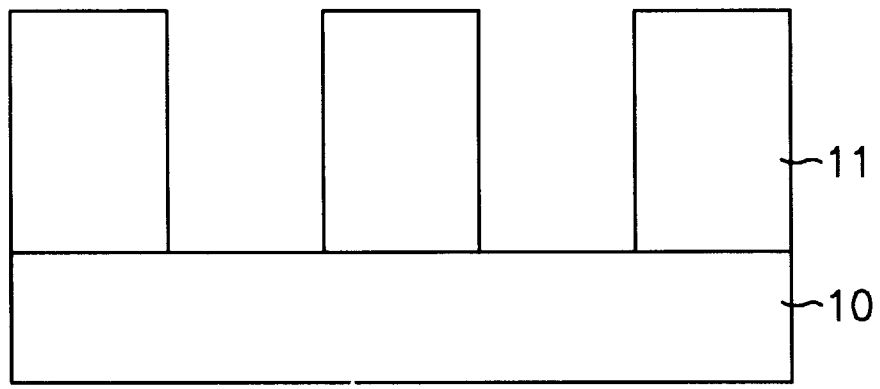
FIGS. 1a to 1g show the processes for forming fine metal patterns using damascene technique in accordance with the prior art.
Figure 1B:
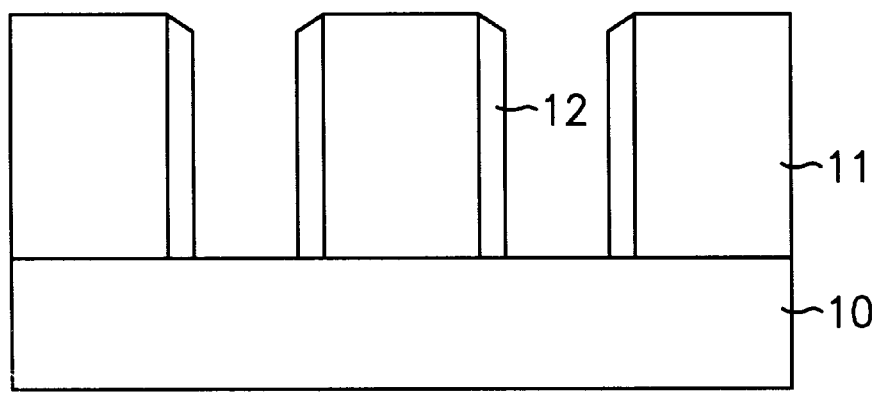
Figure 1C:
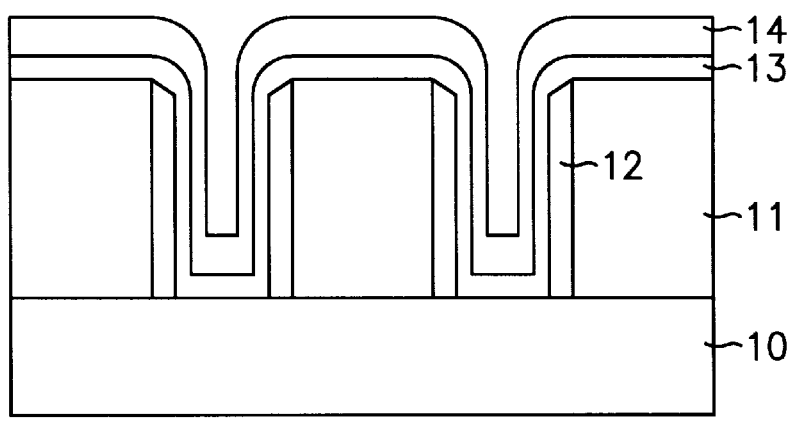
Figure 1D:
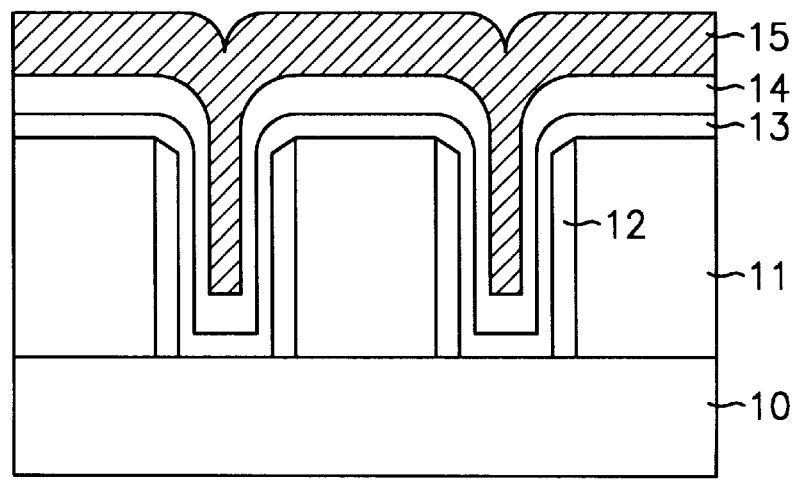
Figure 1E:
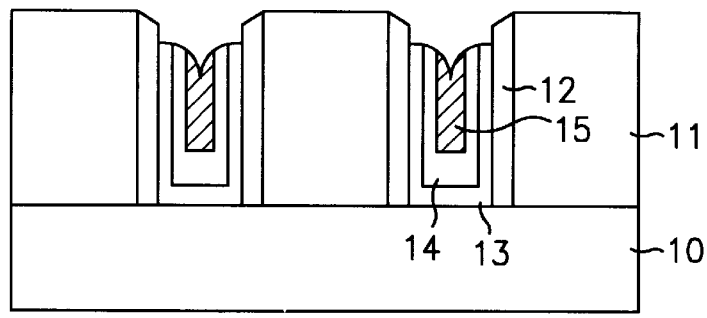
Figure 1F:
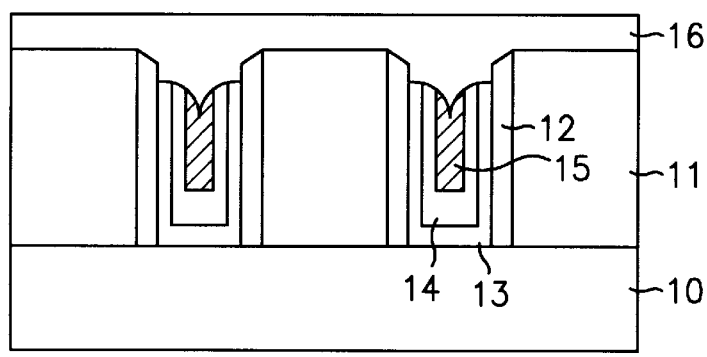
Figure 1G:
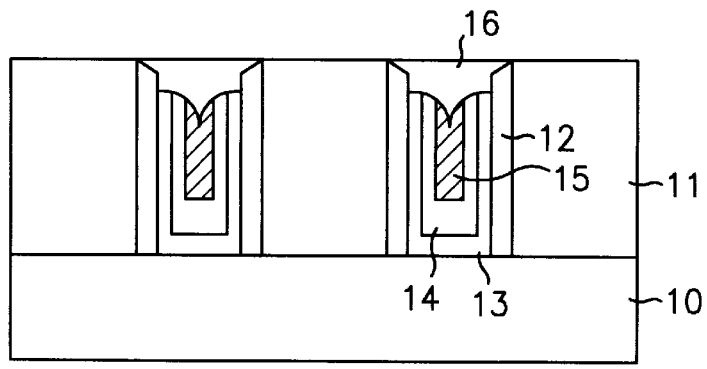
Figure 2A:
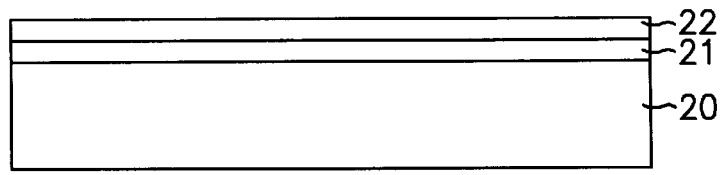
FIGS. 2a to 2k show the processes for forming fine metal patterns using damascene technique in accordance with one embodiment of the present invention.

Referring to FIG. 2a, a glue film 21 and a diffusion barrier film 22 are, in turn, formed on a semiconductor substrate 20. Here, the glue film 21 is for enhancing the adhesive force between the lower layer (semiconductor substrate) and a metal film to be formed later. The glue film 21 may be formed with Ti and the like. The diffusion barrier film 22 is for preventing the metal film from mutually reacting with the glue film 21. The barrier film 22 may be formed with TiN, $WN_x$ or the like.

Figure 2B:
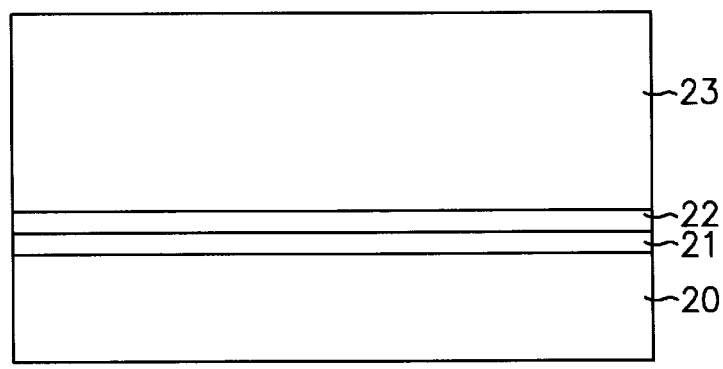
Figure 2C:
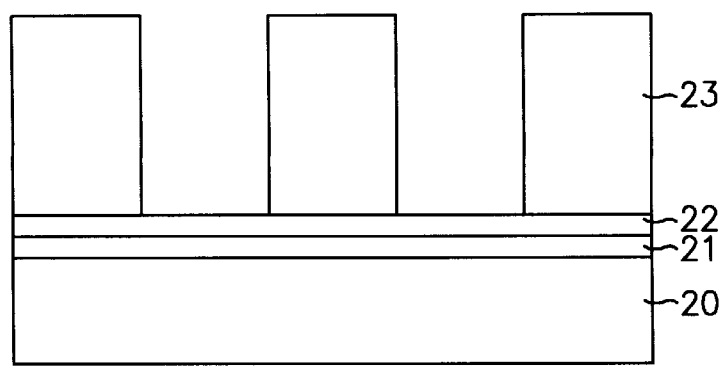
Figure 2D:
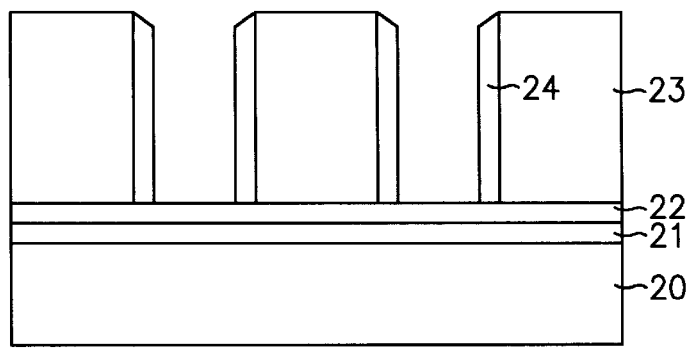

As shown in FIG. 2b, a first insulating film 23 is then formed with an insulating material such as $SiO_2$ on the diffusion barrier film 22. The first insulating film 23 is then selectively etched to form contact holes between the patterns of the insulating film 23 as shown in FIG. 2c. At this time, the barrier film 22 is exposed through the holes. Referring to FIG. 2d, a second insulating film is then deposited with another insulating material such as SiN or SiON over the entire structure and wholly etched to insulating film spacers 24 on the sidewalls of the first insulating film pattern 23. The spacer is for protecting the fine metal pattern in the subsequent process of removing the first insulating film 23 patterns, later.

Figure 2E:
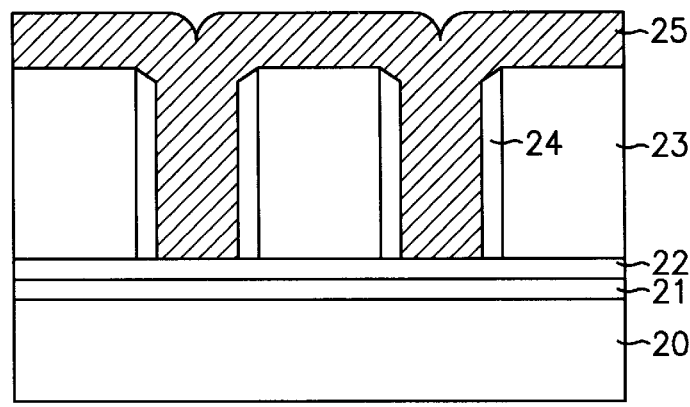
Figure 2F:
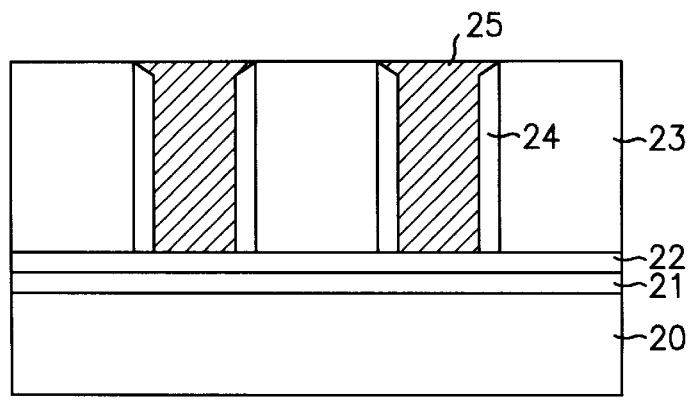
Figure 2G:
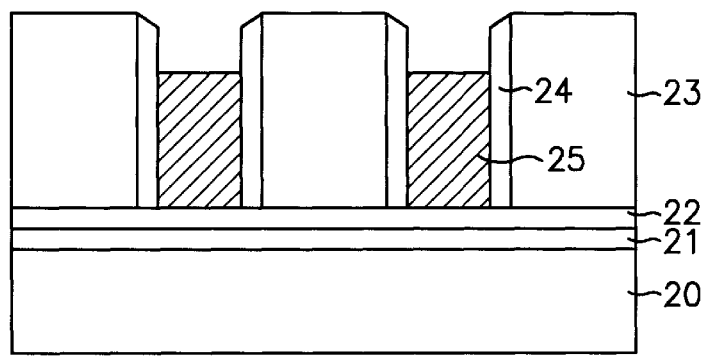

Next, referring to FIGS. 2e and 2f, a metal film 25 is deposited so as to fill it within the holes and then etched by chemical mechanical polishing until the surface of the first insulating film 23 is exposed. The metal film 25 is also etched within the hole to lower its height below that of the first insulating film pattern 23.

Figure 2H:
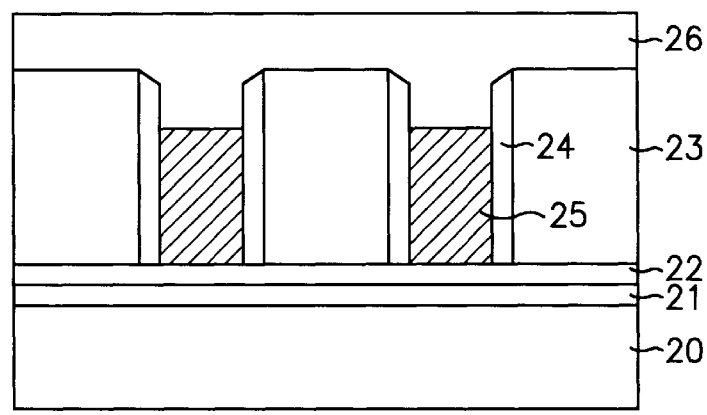
Figure 2I:
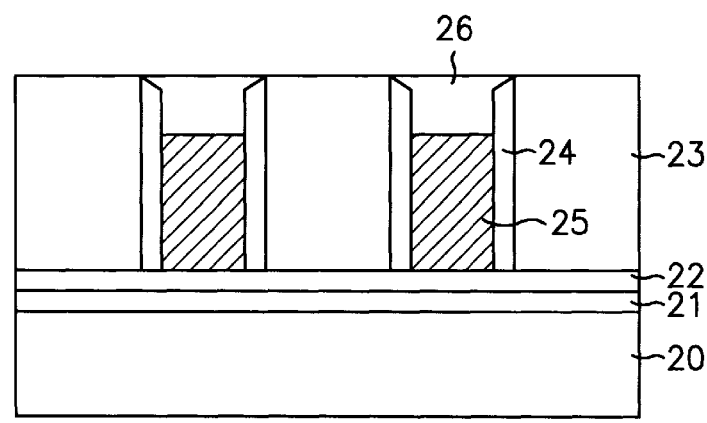

Subsequently, referring to FIGS. 2h and 2i, an etching stop layer 26 is deposited with an insulating material such as SiN or SiON different from the material of the first insulating film 23 and is removed by chemical mechanical polishing or etching until the surface of the first insulating film 23. The etching stop layer 26 is left only on the metal film 25 within the hole and is used as protection layer of the metal film 25 in the process of removing the first insulating film pattern 23 for forming self align contact.

Figure 2J:
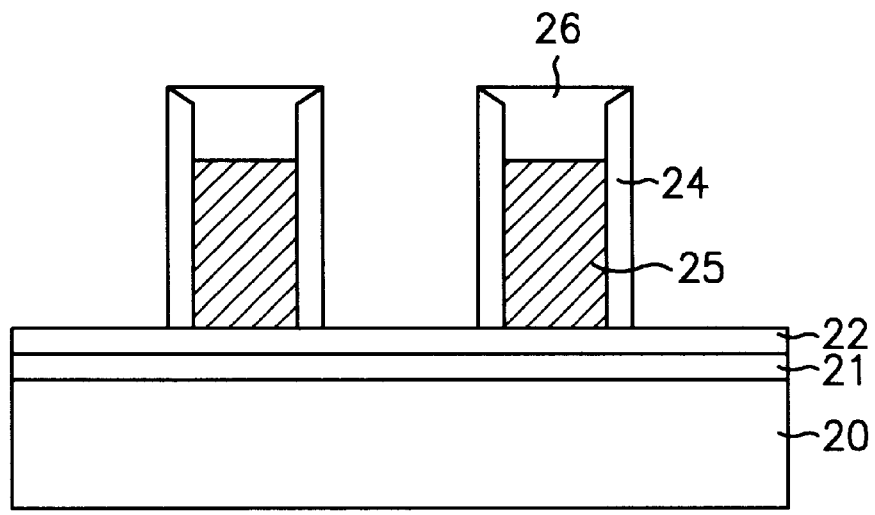
Figure 2K:
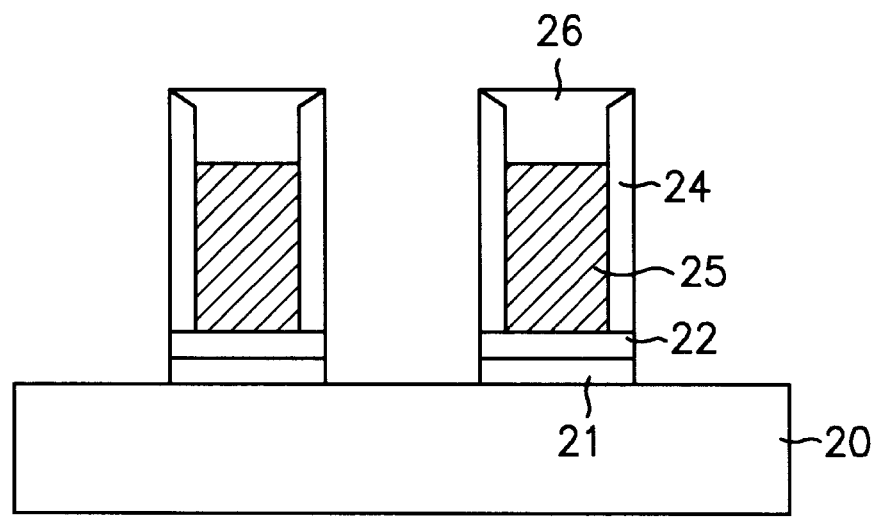

Next, referring to FIG. 2j, the first insulating film patterns 23 are removed to expose the diffusion barrier film 22. Then, as shown in FIG. 2k, the barrier film 22 and the glue film 21 are selectively etched using the etching stop film 26 as an etching mask to complete the processes for forming the fine metal patterns.

FIGS. 3a to 3h show the processes for forming fine metal patterns using damascene technique in accordance with another embodiment of the present invention.

Figure 3A:
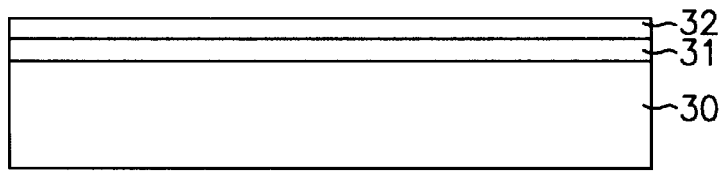
FIGS. 3a to 3h show the processes for forming fine metal patterns using damascene technique in accordance with another embodiment of the present invention.

Referring to FIG. 3a, a glue film 31 and a diffusion barrier film 32 are, in turn, formed on a semiconductor substrate 30. Here, the glue film 31 is for enhancing the adhesive force between the lower layer (semiconductor substrate) and a metal film to be formed later. The glue film 31 may be formed with Ti and the like. The diffusion barrier film 32 is for preventing the metal film from mutually reacting with the glue film 31. The barrier film 32 may be formed with TiN, $WN_x$ or the like.

Figure 3B:
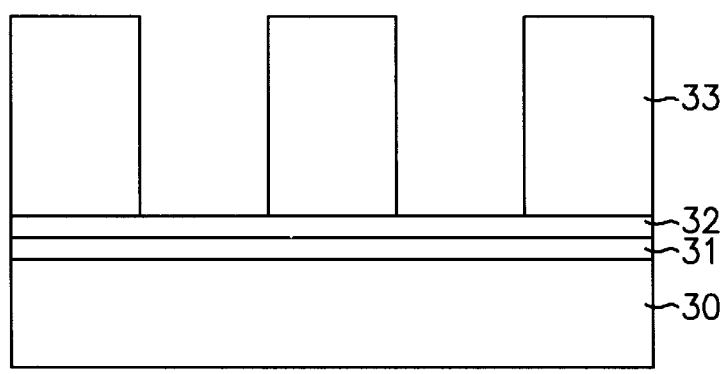
Figure 3C:
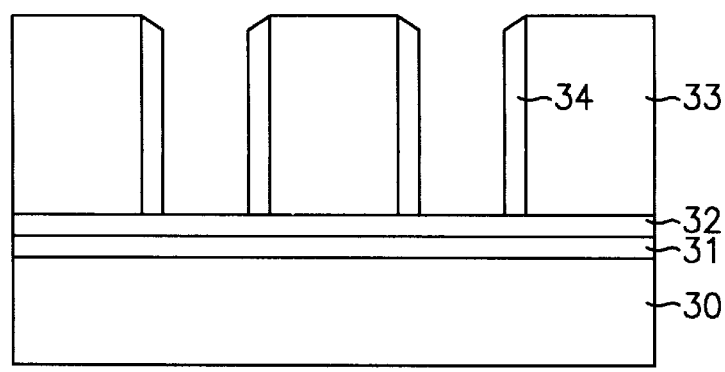

As shown in FIG. 3b, a first insulating film 33 is then formed with an insulating material such as $SiO_2$ on the diffusion barrier film 32. The first insulating film 33 is then selectively etched to form contact holes between the patterns of the insulating film 33. At this time, the barrier film 32 is exposed through the holes. A second insulating film is then deposited with another insulating material such as SiN or SiON over the entire structure and wholly etched to insulating film spacers 34 on the sidewalls of the first insulating film 33 pattern, as shown in FIG. 3c. The spacer is for protecting the fine metal pattern in the subsequent process of removing the first insulating film 33 patterns, later.

Figure 3D:
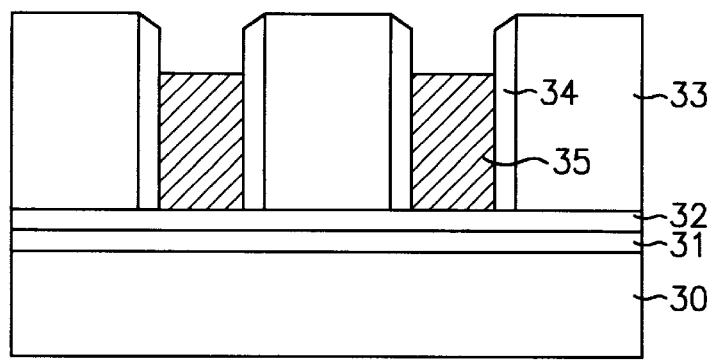

Next, referring to FIGS. 3d, a metal film 35 is deposited only within the hole by a selective growth method. Here, the height of the metal film 35 is lower than that of the first insulating film pattern 33.

Figure 3E:
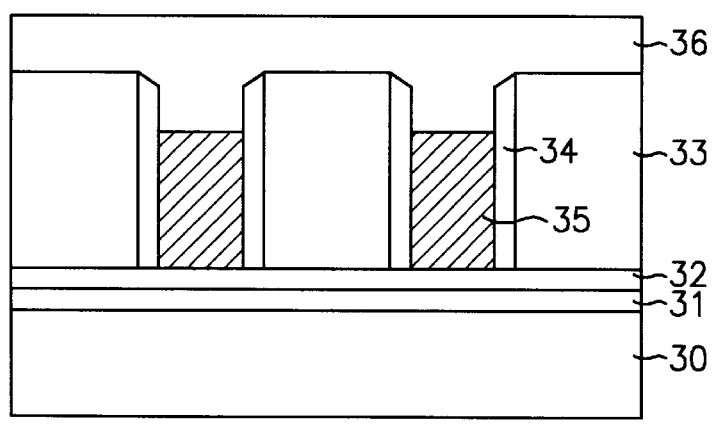
Figure 3F:
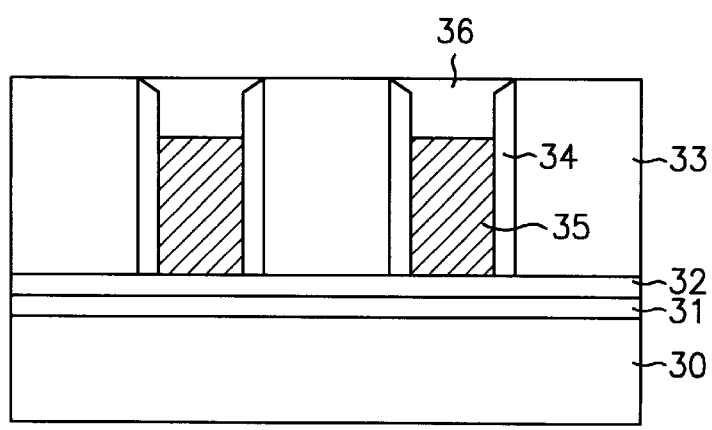

Subsequently, referring to FIGS. 3e and 3f, an etching stop layer 36 is deposited with an insulating material such as SiN or SiON different from the material of the first insulating film 33 and is then removed by chemical mechanical polishing or etching until the surface of the first insulating film 33. The etching stop layer 36 is left only on the metal film 35 within the hole and is used as protection layer of the metal film 35 in the process of removing the first insulating film pattern 33 for forming self align contact.

Figure 3G:
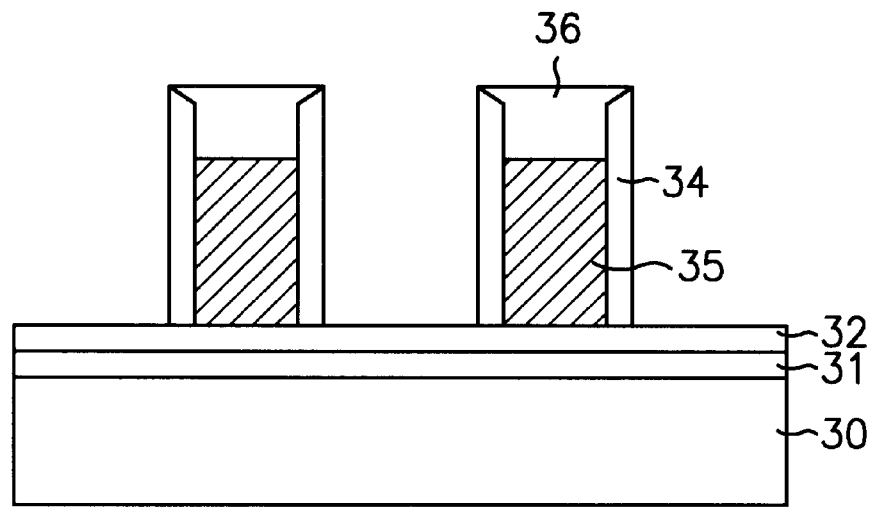
Figure 3H:
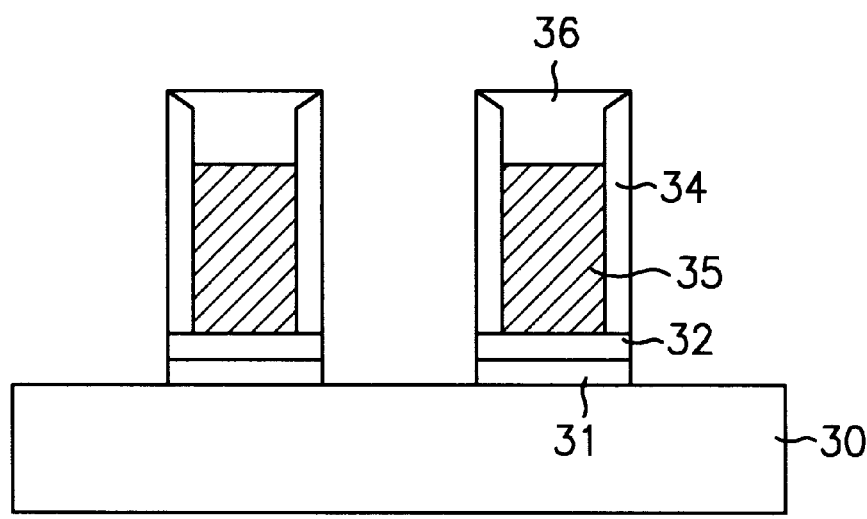

Next, referring to FIG. 3g, the first insulating film patterns 33 are removed to expose the diffusion barrier film 32. Then, the barrier film 32 and the glue film 31 are selectively etched using the etching stop film 36 as an etching mask to complete the processes for forming the fine metal patterns.

While the present invention has been described with respect to certain preferred embodiments only, other modifications and variations may be made without departing from the spirit and scope of the present invention as set forth in the following claims.

What is claimed is:

1. A method for forming fine metal patterns of semiconductor devices using damascene technique, which comprises the steps of:

forming a glue layer and a diffusion barrier film on a lower layer, in turn;

forming on the diffusion barrier film, insulating film patterns which define regions of fine patterns therebetween;

forming a metal film within the fine pattern region;

forming an etching stop film on the metal film within the fine pattern region;

removing the insulating film to expose the diffusion barrier film; and selectively etching the diffusion barrier film and the glue layer using the etching stop film as an etching mask.

2. The method according to claim 1, wherein the step of forming the metal film within the fine pattern region comprises the steps of:

forming the metal film on the entire structure;

polishing the metal film by chemical mechanical polishing until the surface of the first insulating film pattern; and etching the metal film within the fine pattern region to lower the height of the metal film than that of the first insulating film pattern.

3. The method according to claim 1, wherein in the step of forming the metal film within the fine pattern region, the metal film is formed within the fine pattern by selective growth method, the height of the metal film being lower than that of the insulating film pattern.

4. The method according to claim 1, wherein the step of forming the etching stop film on the metal film comprises the steps of forming the etching stop film on the entire structure, and polishing the etching stop film by chemical mechanical polishing until the surface of the insulating film.

5. The method according to claim 1, wherein the insulating film is formed with an insulating layer made of $SiO_2$, and the etching stop film are formed with insulating material such as SiN or SiON.

6. The method according to claim 1, wherein the glue film is formed with Ti, and the diffusion barrier film is formed with TiN or $WN_x$.

7. A method for forming fine metal patterns of semiconductor devices using damascene technique, which comprises the steps of:

forming a glue layer and a diffusion barrier film on a lower layer, in turn;

forming on the diffusion barrier film, a first insulating film and selectively etching it to form the first insulating film patterns which define regions of fine patterns therebetween;

forming a second insulating film over the entire structure and wholly etching it to form insulating film spacers on the sidewells of the first insulating film pattern;

forming a metal film within the fine pattern region;

forming an etching stop film on the metal film within the fine pattern region;

removing the insulating film to expose the diffusion barrier film; and selectively etching the diffusion barrier film and the glue layer using the etching stop film as an etching mask.

8. The method according to claim 7, wherein the step of forming the metal film within the fine pattern region comprises the steps of:

forming the metal film on the entire structure;

polishing the metal film by chemical mechanical polishing until the surface of the first insulating film pattern; and etching the metal film within the fine pattern region to lower the height of the metal film than that of the first insulating film pattern.

9. The method according to claim 7, wherein in the step of forming the metal film within the fine pattern region, the metal film is formed within the fine pattern by selective growth method, the height of the metal film being lower than that of the first insulating film pattern.

10. The method according to claim 7, wherein the step of forming the etching stop film on the metal film comprises the steps of forming the etching stop film on the entire structure, and polishing the etching stop film by chemical mechanical polishing until the surface of the first insulating film.

11. The method according to claim 7, wherein the first insulating film is formed with an insulating layer made of $SiO_2$, and the second insulating film and the etching stop film are formed with insulating material such as SiN or SiON, respectively.

12. The method according to claim 7, wherein the glue film is formed with Ti, and the diffusion barrier film is formed with TiN or $WN_x$.

* * * * *